United States Patent
Habeck

(10) Patent No.: US 10,658,099 B2
(45) Date of Patent: May 19, 2020

(54) MAGNETIC LATCH FOR A DISPLAY MODULE

(71) Applicant: Daktronics, Inc., Brookings, SD (US)

(72) Inventor: Dan Habeck, Harrisburg, SD (US)

(73) Assignee: Daktronics, Inc., Brookings, SD (US)

( * ) Notice: Subject to any disclaimer, the term of this patent is extended or adjusted under 35 U.S.C. 154(b) by 0 days.

(21) Appl. No.: 16/103,480

(22) Filed: Aug. 14, 2018

(65) Prior Publication Data

US 2019/0057799 A1 Feb. 21, 2019

Related U.S. Application Data

(60) Provisional application No. 62/546,341, filed on Aug. 16, 2017.

(51) Int. Cl.
*H01F 7/02* (2006.01)
*G06F 9/302* (2018.01)
(Continued)

(52) U.S. Cl.
CPC ............... *H01F 7/02* (2013.01); *F16B 1/00* (2013.01); *G09F 9/3026* (2013.01); *G09F 9/33* (2013.01);
(Continued)

(58) Field of Classification Search
CPC .................................. G09F 9/33; G09F 9/3026
See application file for complete search history.

(56) References Cited

U.S. PATENT DOCUMENTS

| 2007/0204500 A1* | 9/2007 | Splittgerber | A47G 1/06 40/781 |
|---|---|---|---|
| 2011/0001025 A1* | 1/2011 | Fiedler | A45C 13/1069 248/206.5 |

(Continued)

FOREIGN PATENT DOCUMENTS

| CN | 203733418 U | 7/2014 |
|---|---|---|
| CN | 106973534 A | 7/2017 |

(Continued)

OTHER PUBLICATIONS

"International Application Serial No. PCT/US2018/046703, International Search Report dated Nov. 21, 2018", 5 pgs.

(Continued)

*Primary Examiner* — Andrew J Coughlin
*Assistant Examiner* — Zachary J Snyder
(74) *Attorney, Agent, or Firm* — Schwegman Lundberg & Woessner, P.A.

(57) ABSTRACT

The present disclosure provides a display module. The module includes a module support structure, a plurality of light-emitting elements coupled to the module support structure, and one or more latch assemblies configured to removeably couple the module support structure to a support chassis. Each of the one or more latch assemblies includes a first magnet movably coupled with the module support structure at a first location. The assemblies further include a second magnet movably coupled with the module support structure at a second location. The second magnet is movable relative to the module support structure between a first corresponding position and a second corresponding position. The assemblies further include a shaft connecting the first magnet and the second magnet so that the first magnet and the second magnet move together.

20 Claims, 9 Drawing Sheets

(51) Int. Cl.
  *F16B 1/00* (2006.01)
  *G09F 9/33* (2006.01)
  *H05K 5/00* (2006.01)
  *H05K 5/02* (2006.01)
  *G09F 9/302* (2006.01)

(52) U.S. Cl.
  CPC ......... *H05K 5/0017* (2013.01); *H05K 5/0021* (2013.01); *H05K 5/0221* (2013.01); *F16B 2001/0035* (2013.01)

(56) References Cited

U.S. PATENT DOCUMENTS

| | | |
|---|---|---|
| 2015/0055279 A1 | 2/2015 | Mcbroom et al. |
| 2016/0210886 A1* | 7/2016 | Brashnyk .............. G09F 9/3026 |
| 2017/0006727 A1 | 1/2017 | Ryu et al. |
| 2019/0037712 A1 | 1/2019 | Kim et al. |
| 2019/0059166 A1 | 2/2019 | Habeck |

FOREIGN PATENT DOCUMENTS

| | | |
|---|---|---|
| WO | WO-2016109439 A1 | 7/2016 |
| WO | WO-2019036467 A1 | 2/2019 |
| WO | WO-2019036469 A1 | 2/2019 |

OTHER PUBLICATIONS

"International Application Serial No. PCT/US2018/046703, Written Opinion dated Nov. 21, 2018", 6 pgs.

"International Application Serial No. PCT/US2018/046699, International Search Report dated Oct. 26, 2018", 4 pgs.

"International Application Serial No. PCT/US2018/046699, Written Opinion dated Oct. 26, 2018", 6 pgs.

"U.S. Appl. No. 16/103,489, Non Final Office Action dated Jun. 27, 2019", 12 pgs.

"U.S. Appl. No. 16/103,489, Response filed Sep. 27, 2019 to Non-Final Office Action dated Jun. 27, 2019", 13 pgs.

* cited by examiner

MAGNETIC LATCH FOR A DISPLAY MODULE

CROSS-REFERENCE TO RELATED APPLICATION

This application claims the benefit of priority to U.S. Provisional Patent Application Ser. No. 62/546,341 entitled "MAGNETIC LATCH FOR A DISPLAY MODULE," filed Aug. 16, 2017, the disclosure of which is incorporated herein in its entirety by reference.

BACKGROUND

Displays comprising a plurality of light-emitting elements are used to display one or more of textual, graphical, or video information. In some applications, such as digital billboards or scoreboards, individual display modules are connected to one or more supports and operated collectively to form a larger display.

SUMMARY OF THE DISCLOSURE

The present disclosure provides a display module. The module includes a module support structure, a plurality of light-emitting elements coupled to the module support structure, and one or more latch assemblies configured to removeably couple the module support structure to a support chassis. Each of the one or more latch assemblies includes a first magnet movably coupled with the module support structure at a first location. The first magnet is movable relative to the module support structure between a first position and a second position. The assemblies further include a second magnet movably coupled with the module support structure at a second location. The second magnet is movable relative to the module support structure between a first corresponding position and a second corresponding position. The assemblies further include a shaft connecting the first magnet and the second magnet so that the first magnet and the second magnet move together such that the second magnet is in the first corresponding position when the first magnet is in the first position and is in the second corresponding position when the first magnet is in the first position. A magnetic attraction between the second magnet and a corresponding third magnet attached to the support chassis is stronger when the second magnet is in the first corresponding than when the second magnet is in the second corresponding position.

The present disclosure further provides a latching system for removably coupling a display module to a support chassis. The latching system includes one or more magnet subassemblies. Each subassembly includes a first magnet movably coupled to the display module at a first cavity. The first magnet is movable relative to the display module between a first position and a second position. Each subassembly further includes a second magnet movably coupled with the display module at a second cavity, and a connecting member disposed in a passage between the first recess and the second recess. The connecting member connects the first magnet and the second magnet so that the first magnet and the second magnet move together such that the second magnet is in a first corresponding position when the first magnet is in the first position and is in a second corresponding position when the first magnet is in the second position. Each subassembly further includes a corresponding third magnet attached to the support chassis for each of the one or more magnet subassemblies. The second magnet and the corresponding third magnet are proximate to each other when the display module is mounted to the support chassis. A mounting magnetic force is formed between the second magnet and the fourth magnet when the second magnet is in the first corresponding position. The system further includes an actuation tool comprising a fourth magnet, wherein the actuation tool is positionable proximate to the first magnet of a magnet subassembly so that an actuation magnetic attraction is formed between the fourth magnet and the first magnet so that when the actuation tool is moved from an unlatched position toward a latched position the first magnet will move from the first position toward the second position, which will cause the second magnet to move from the first corresponding position toward the second corresponding position so that the mounting magnetic attraction is generated between the second magnet and the third magnet.

The present disclosure further provides a method for mounting a display module to a support chassis. The method includes providing or receiving one or more latch assemblies coupled to a module support structure of the display module. Each of the one or more latch assemblies comprises a first magnet movably coupled with the module support structure at a first location. The first magnet is movable relative to the module support structure between a first position and a second position. A second magnet is movably coupled with the module support structure at a second location. The second magnet is movable relative to the module support structure between an unlatched position and a latched position. A shaft connects the first magnet and the second magnet so that the first magnet and the second magnet move together such that the second magnet is in the unlatched when the first magnet is in the first position and is in the latched position when the first magnet is in the first position. The method further includes positioning the display module so that the second magnet of each of the one or more latch assemblies is proximate to a corresponding third magnet attached to the support chassis. The method further includes moving the first magnet of each of the latch assemblies from the first position to the second position so that the second magnet of each of the one or more latch assemblies is moved from the unlatched position to the latched position so that a north pole of the second magnet is aligned with a south pole of the corresponding third magnet, or a south pole of the second magnet is aligned with a north pole of the corresponding third magnet, or both, so that a magnetic mounting force is formed between the second magnet of the one or more latch assemblies and the corresponding third magnet.

The present inventors have recognized, among other things, that a problem to be solved can include providing an assembly that allows for easy access to components for adjusting a z-directional spacing between a display board and a carrier while minimizing the amount available display surface that is wasted by including external attachment apparatuses. The subject matter described herein provides a solution to this problem because the assemblies and methods described herein present an internal biasing element that adjusts the z-directional distance between the display board and the carrier, the biasing element can be disposed underneath a display surface and operated with a tool that is contacted with the display surface. This way the entirety of the display surface can be used to display content. There is not any external space dedicated to providing access to the biasing element.

BRIEF DESCRIPTION OF THE FIGURES

In the drawings, which are not necessarily drawn to scale, like numerals describe substantially similar components throughout the several views. The drawings illustrate generally, by way of example, but not by way of limitation, various embodiments discussed in the present document.

The patent or application file contains at least one drawing executed in color. Copies of this patent or patent application publication with color drawing(s) will be provided by the Office upon request and payment of the necessary fee.

DETAILED DESCRIPTION

Figure 1:
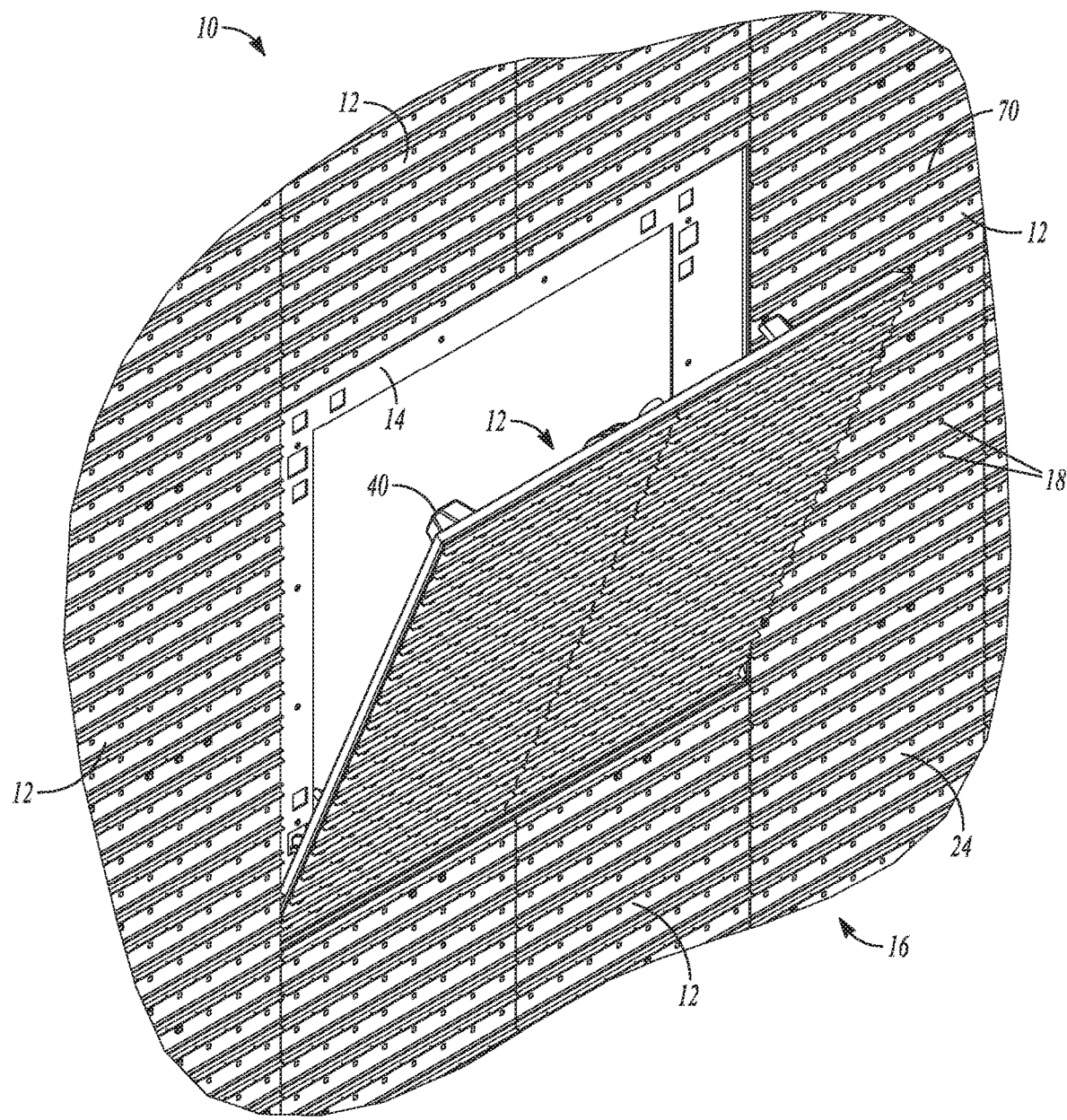
FIG. 1 is a partial perspective view of an example light-emitting display comprising a plurality of individual display modules that are operated in a cooperative manner to display information on the light-emitting display.

Reference will now be made in detail to certain embodiments of the disclosed subject matter, examples of which are illustrated in part in the accompanying drawings. While the disclosed subject matter will be described in conjunction with the enumerated claims, it will be understood that the exemplified subject matter is not intended to limit the claims to the disclosed subject matter.

Throughout this document, values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "about 0.1% to about 5%" or "about 0.1% to 5%" should be interpreted to include not just about 0.1% to about 5%, but also the individual values (e.g., 1%, 2%, 3%, and 4%) and the sub-ranges (e.g., 0.1% to 0.5%, 1.1% to 2.2%, 3.3% to 4.4%) within the indicated range. The statement "about X to Y" has the same meaning as "about X to about Y," unless indicated otherwise. Likewise, the statements "about X, Y, or Z" or "about X, Y, or about Z" have the same meaning as "about X, about Y, or about Z," unless indicated otherwise.

In this document, the terms "a," "an," or "the" are used to include one or more than one unless the context clearly dictates otherwise. The term "or" is used to refer to a nonexclusive "or" unless otherwise indicated. The statement "at least one of A and B" has the same meaning as "A, B, or A and B." In addition, it is to be understood that the phraseology or terminology employed herein, and not otherwise defined, is for the purpose of description only and not of limitation. Any use of section headings is intended to aid reading of the document and is not to be interpreted as limiting; information that is relevant to a section heading may occur within or outside of that particular section.

In the methods described herein, the acts can be carried out in any order without departing from the principles of the disclosure, except when a temporal or operational sequence is explicitly recited. Furthermore, specified acts can be carried out concurrently unless explicit claim language recites that they be carried out separately. For example, a claimed act of doing X and a claimed act of doing Y can be conducted simultaneously within a single operation, and the resulting process will fall within the literal scope of the claimed process.

The term "about" as used herein can allow for a degree of variability in a value or range, for example, within 10%, within 5%, or within 1% of a stated value or of a stated limit of a range, and includes the exact stated value or range.

The term "substantially" as used herein refers to a majority of, or mostly, for example within about 50% or less of a recited value if one is provided, such as within about 40% or less, 30% or less, 20% or less, 10% or, 5% or less, 4% or less, 3% or less, 2% or less, 1% or less, 0.5% or less, 0.1% or less, 0.01% or less, or within about 0.001% of the recited value or less, or equal to the recited value.

In the following detailed description, reference is made to the accompanying drawings which form a part hereof. The drawings show, by way of illustration, examples of light-emitting displays that are configured display to one or more of video, graphical, or textual information and examples of systems for mounting one or more display modules of a display to a support structure, such as a support structure of a building or a support chassis mounted thereto. The support structure can include a circuit board mounted to a frame or housing with light emitting diodes electronically mounted to the circuit board. The examples are described in sufficient detail to enable those skilled in the art to practice, and it is to be understood that other embodiments can be utilized and that changes can be made without departing from the scope of the present disclosure. Therefore, the following detailed description is not to be taken in a limiting sense, and the scope of the present disclosure is defined by the appended claims and their equivalents.

FIG. 1 shows an example of an information display 10 (also referred to simply as "display 10") that is configured to display one or more of video, graphical, or textual information. The display 10 includes a plurality of individual display modules 12 mounted to one or more supports 14, such as a support chassis or a frame. Module 12 is mounted to support 14 by latch 40 and adjusted by biasing element 70. The plurality of display modules 12 are operable together so that the overall display 10 appears as a single, larger display. FIG. 1 shows one of the display modules 12 being in a tilted position relative to the support 14, which can occur when that display module 12 is in the process of being mounted to, or dismounted from, the support 14. The other display modules 12 in the display 10 are mounted to the support 14.

The display 10 can include a display surface 16 configured to display the video, graphical, or textual information from the display 10. A plurality of light-emitting elements 18 are mounted to the display surface 16. For example, the plurality of light-emitting elements can be mounted to one or more mounting structures, such as one or more of a circuit board, potting, or a module frame of a corresponding display module 12. The light-emitting elements 18 are operated together to display the video, graphical, or textual information on the display 10.

The light-emitting elements 18 can be any type of light-emitting technology known or yet to be discovered for the emission of light from a small area, particularly for light-emitting technology that is or can be used display of visual information, such as video, graphical, or textual information. At the time of filing of the present application, light-emitting diodes (LEDs) are one of the most common light-emitting technologies in use for video or graphical displays of the type described herein. As such, for the sake of brevity, the remainder of the present disclosure will refer to light-emitting elements that can be used in a display (including the light-emitting elements 18 of FIGS. 1 and 2) will be referred to as LEDs. However, those of skill in the art will appreciate that any time the present disclosure uses the term "light-emitting diode" or "LED," that light-emitting devices other than LEDs can be used, including, but not limited to, liquid crystal display devices (LCDs), organic light-emitting diodes (OLEDs), organic light-emitting transistors (OLETs), surface-conduction electron-emitter display devices (SEDs), field-emission display devices (FEDs), laser TV quantum dot liquid crystal display devices (QD-LCDs), quantum dot light-emitting diode display devices (QD-LEDs), ferro-liquid display devices (FLDs), and thick-film dielectric electroluminescent devices (TDELs).

Figure 2:
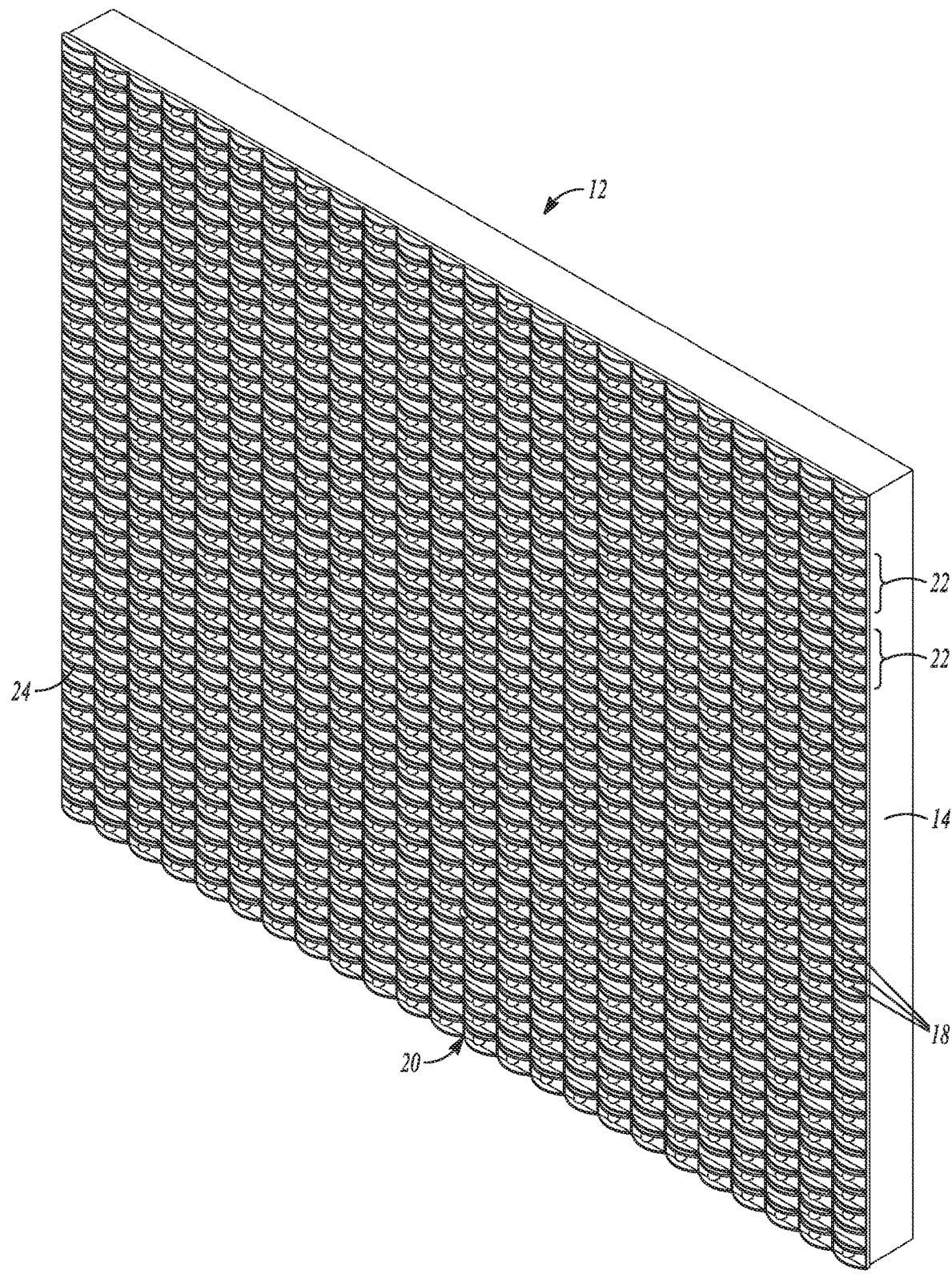
FIG. 2 is a perspective view of an example light-emitting display module, which can be used as one of the individual display modules in the light-emitting display of FIG. 1.

FIG. 2 is a perspective view of an example display module 12 that can be used in the display 10 of FIG. 1. The display module 12 includes a face 20 configured to provide for a display of graphics or video content. A plurality of the LEDs 18 are positioned on the face 20 and the LEDs 18 can be operated in such a way that the display module 12 will display a portion of the video, graphical, or textual information to be shown on the display 10. The face 20 of the display module 12 is aligned and oriented relative to faces 20 of one or more adjacently-positioned LEDs 18 so that the faces 20 combine to form the display surface 16 of the overall display 10 shown in FIG. 1. The plurality of display modules 12 are operated together in such a way as to display the video, graphical, or textual information in a cohesive manner so that the entire display 10 appears to a viewer as a single display that is larger than the individual display modules 12.

In an example, the LEDs 18 are arranged into an array of pixels 22 (best seen in FIG. 2). Each pixel 22 includes one or more LEDs 18 grouped together in close proximity. The proximity of the pixels 22 allows the display 10 to be operated in such a way that they will appear to a viewer of the display 10 to form recognizable shapes, such as letters or numbers to display textual information or recognizable shapes to display graphical or video information. In some examples, the plurality of LEDs 18 include a plurality of different-colored LEDs 18 such that different-colored LEDs 18 of each pixel 22 can be cooperatively operated to display what appears to be a spectrum of different colors for the viewer of the display 10. In an example, each pixel 22 includes a red LED 18, a green LED 18, and a blue LED 18, wherein the red, green, and blue LEDs of each pixel 22 cooperate to provide essentially the entire color spectrum that is visible to humans based on whether one, two, or all three of the LEDs 18 in a pixel 22 are lit, and at what intensities. The display 10 can also provide a black or empty looking surface over a portion of the display, when desired, by deactivating or turning off the LEDs in a designated area of pixels 22.

In an example, the pixels 22 are arranged in a grid-like array, such as a grid including a specified number of rows and a specified number of columns of the pixels 22. The display 10 can be controlled, for example with control software and/or one or more hardware controllers, so that visual information, e.g., video, graphical, or textual information, is broken into coordinates. Each coordinate can correspond to a specific pixel location within the overall display 10, and the control software and/or the one or more hardware controllers can operate each pixel according to a program that specifies a condition for each coordinate within the display 10 and controls each of the pixels 22 so that it will appear to emit light that meets the condition specified. For example, if the display 10 is displaying a series of textual messages, the control software and/or the one or more hardware controllers can be fed the data corresponding to the series of textual messages, and the control software and/or the one or more hardware controllers can break the text of the messages down into conditions for each pixel 22, such as the time within the series of messages, the color that a pixel 22 is to display at that time (if the display 10 is a multi-colored display) and the intensity of the pixel 22 at that time. The control software and/or the one or more hardware controllers can also convert the information regarding color and intensity into specific operating parameters for each LED 18 in a particular pixel 22, such as the power that will be supplied to the red LED 18, the blue LED 18, and the green LED 18 in that pixel 22 and for how long in order to achieve the specified color and intensity at the specified time. The control software and/or the one or more hardware controllers can then send control signals to the pixels 22 or to individual LEDs 18 that can operate the pixels 22 according to the specified series of textual messages. Although a grid or grid-like array of LED pixels, as summarized above, is common, the display 10 described herein can use other arrangements of the LEDs 18 or other systems for addressing the LEDs 18 can be used without varying from the scope of the present invention.

The display 10 can include a face cover 24 that is placed over a front face of the display 10. The face cover 24 can provide protection for one or more of the LEDs 18, the display surface 16, and the electrical components of the display modules 12 that provide for the operation of the LEDs 12.

Figure 3A:
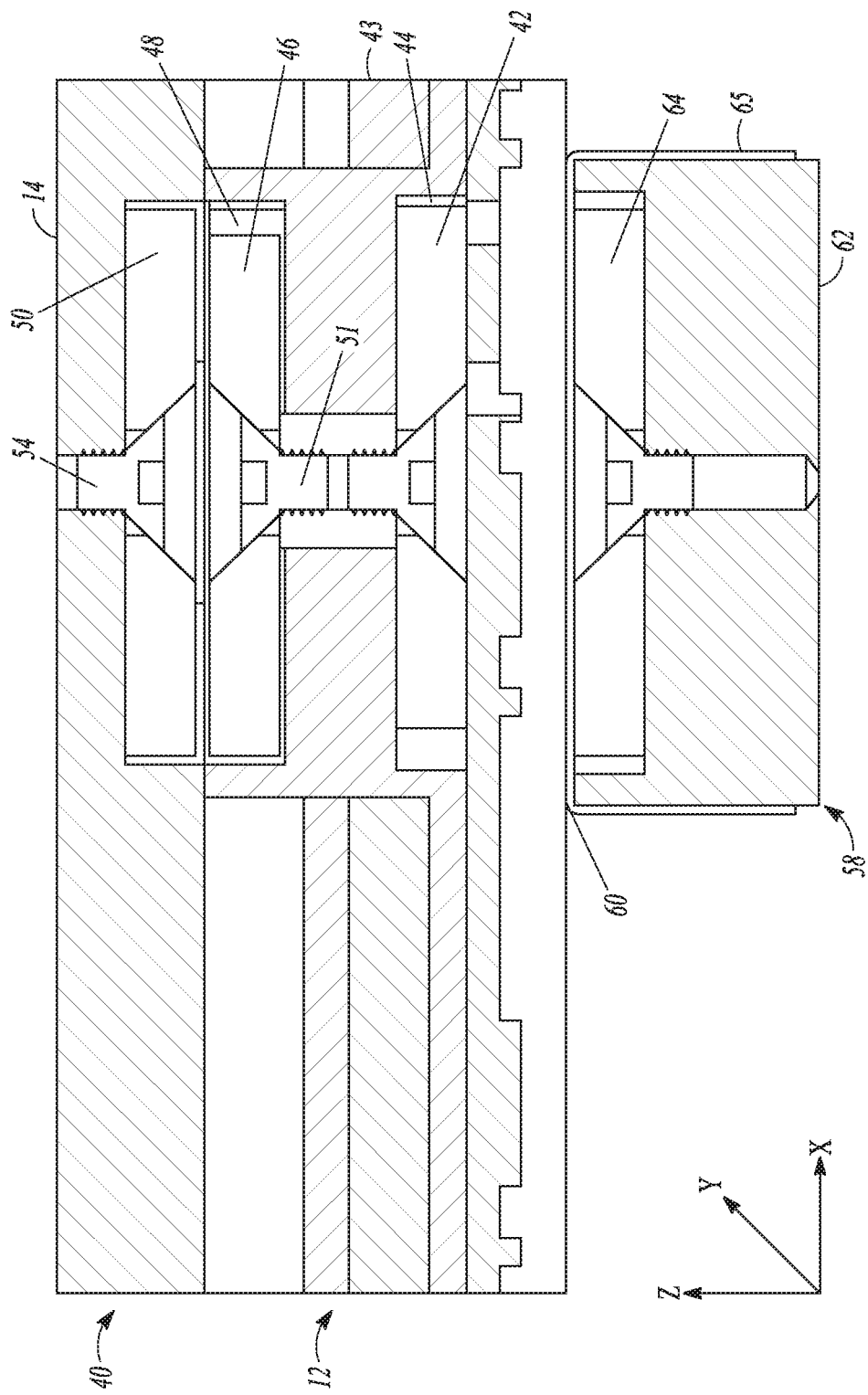
FIG. 3A is a sectional view of a latch, in accordance with various embodiments.
Figure 3B:
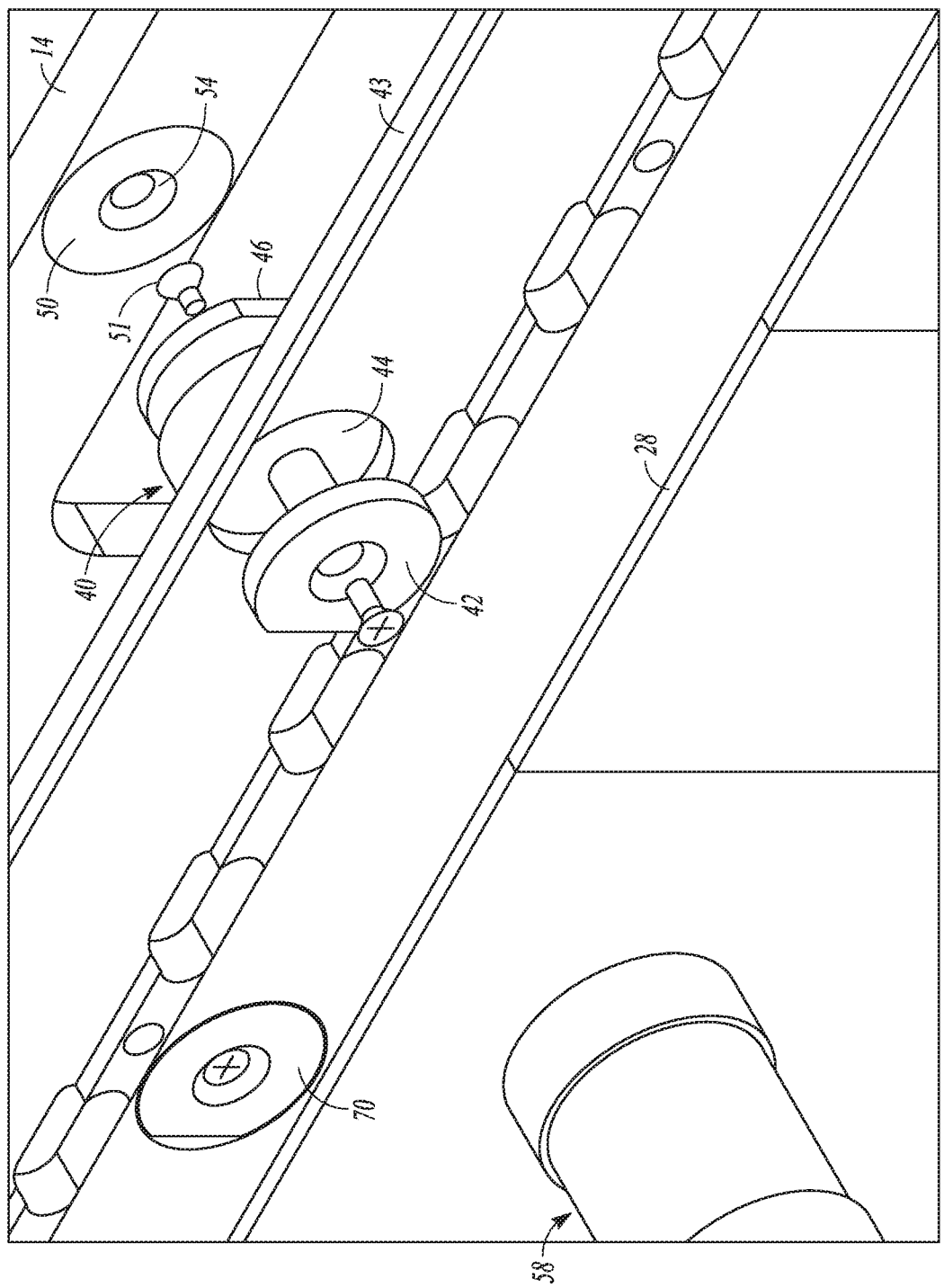
FIG. 3B is an exploded perspective view of the latch of FIG. 2A, in accordance with various embodiments.

FIG. 3A shows a sectional view of an example of the latch 40 that can be used for mounting a display module 12 to the support chassis 14. FIG. 3B shows an exploded perspective view of the example latch 40 of FIG. 3A. As shown the display module 12 includes a display area, e.g., the portion of the front face 28 of the display module 12 where the LEDs 18 are mounted and where an image or other information will appear. In an example, the display area, makes up from about 90% to about 100% of the surface area of a first major surface. The display module 12 also includes a housing 43 defining second major surface that generally opposes the first major surface. The magnetic latch 40 includes a first magnet 42. As described in more detail below, in an example, the first magnet 42 is rotated, which in turn drives the rotation of a second magnet 46 between a latched position and an unlatched position. In other words, the first magnet 42 imparts torque onto the second magnet 46. For this reason, the first magnet 42 will also be referred to as the "torque magnet 42."

In an example, the torque magnet 42 is at least partially internally disposed within the display module 12, such as near the first major surface at least partially within pocket 44. In an example, the second magnet 46 is at least partially externally disposed on the backside of the display module 12, for example within a recess 48 of the housing 43. For this reason, the second magnet 46 will also be referred to as the "housing latch magnet 46." In an example, the torque magnet 42 and the housing latch magnet 46 are joined by a connector such as shaft 51. In an example, the shaft 51 extends through a passage 52 in the display module 12 between the pocket 44 (which receives the torque magnet 42) and the recess 48 (which receives the housing latch magnet 46). As a result of being joined, the torque magnet 42 and the housing latch magnet 46 move as one piece, i.e., so that when the torque magnet 42 moves from a first position to a second position, it transfers force to the housing latch magnet 46 via the shaft 51 so that the housing latch magnet 46 will move from a corresponding first position (i.e., the unlatched position) to a corresponding second position (i.e., the latched position). As used herein, the term "position" when referring to the magnets 42, 46 refers to a position of the magnet 42, 46 relative to a reference structure (such as the housing 43 of the display module 12) or to an orientation of the magnet 42, 46 relative to the reference structure, including the polarity orientation of the magnet. For example, the torque magnet 42 can be considered to have changed from the "first position" to the "second position" if the torque magnet 42 has been moved laterally relative to the display module 12 (i.e., along the first major surface), or if the relative orientation of the torque magnet 42 has changed relative to the display module 12 (i.e., by rotating the torque magnet 42 relative to the display module 12 such that the direction of polar axis of the magnet, e.g., about a rotational axis that is normal or substantially normal to the first major surface). In an example, shown in FIG. 3A, the torque magnet 42 and the housing latch magnet 46 are adapted to rotate along an x-y plane in the pocket 44 and the recess 48, respectively.

The magnetic latch 40 further includes a third magnet 50. The third magnet 50 is coupled to the support chassis 14 to which the display module 12 is to be mounted. For this reason, the third magnet 50 will also be referred to as the "chassis latch magnet 50." In an example, the chassis latch magnet 50 is externally disposed at a mounting surface 13 of the support chassis 15. In an example, the second major surface of the display module 12 (e.g., the rear face of the display module 12) is positioned to be proximate to and facing the chassis mounting surface 13 so that the housing latch magnet 46 is proximate to the chassis latch magnet 50. In an example, the chassis latch magnet 50 is attached to the support chassis 14 by a fastener 54, such as a bolt or a screw. The fastener 54, as well as any other bolt or screw of display 10, can be made from a non-ferrous material so as to minimize interactions with any of the magnets described herein. At least a portion of the housing latch magnet 46 is magnetically attracted to a corresponding portion of the chassis latch magnet 50.

Figure 4A:
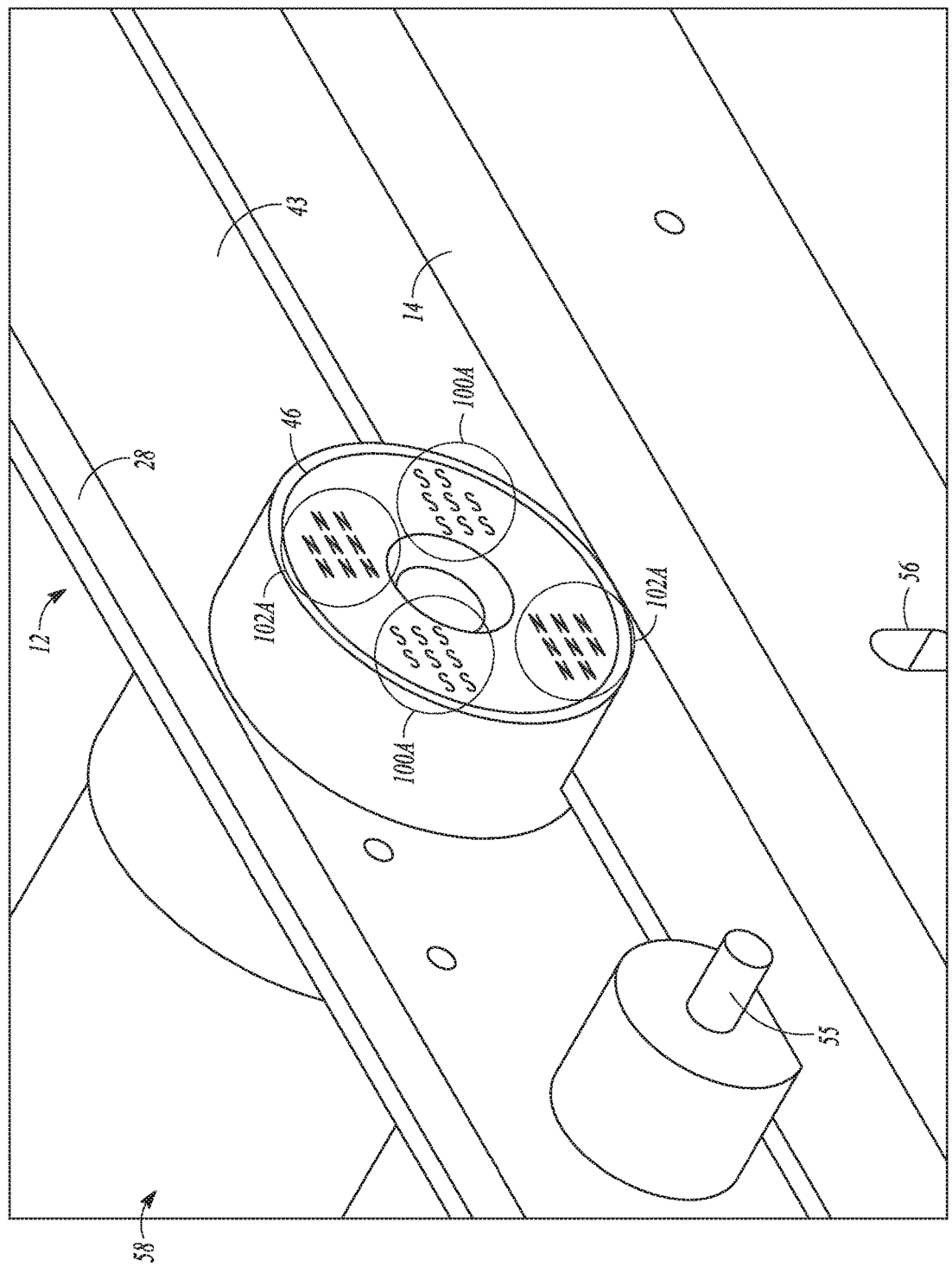
FIG. 4A is a perspective view of a housing latch magnet and the poles thereon, in accordance with various embodiments.
Figure 4B:
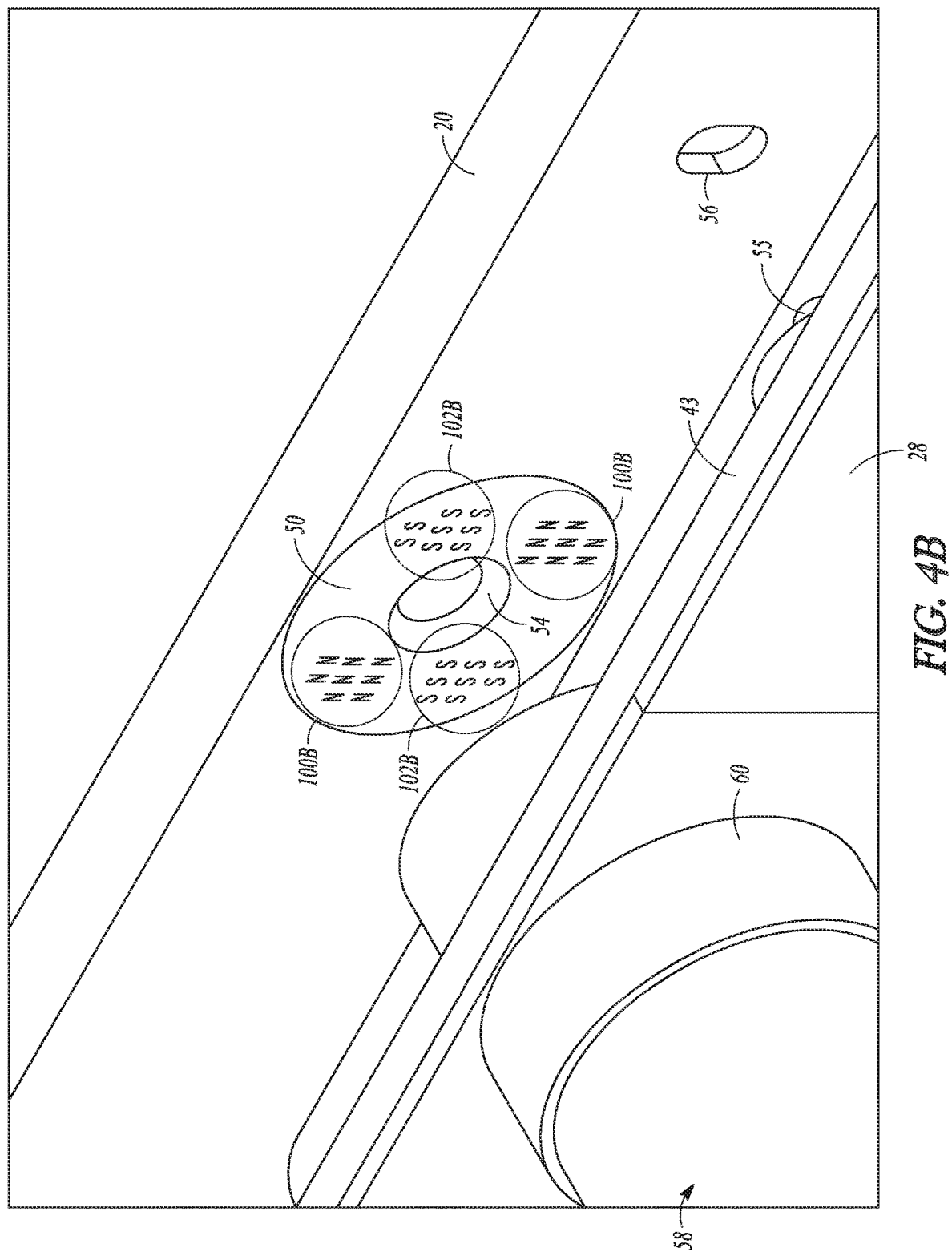
FIG. 4B is a perspective view showing a carrier latch magnet and the poles thereon, in accordance with various embodiments.

In an example, depicted in FIGS. 4A and 4B, one or more first portions of the major surfaces of either of magnets 46 or 50 corresponds to a north pole (indicated by the plurality of "Ns" in one or more north pole regions 100A on the housing latch magnet 46 in FIG. 4A and in one or more north pole regions 100B on the chassis latch magnet 50 in FIG. 4B), while one or more second portions of the major surfaces of each magnet 46, 50 corresponds to a south pole (as indicated by the "Ss" in one or more south pole regions 102A on the housing latch magnet 46 in FIG. 4A and in the south pole regions 102B on the chassis latch magnet in FIG. 4B. In an example, about half of the surface area of each major surface of the magnets 46, 50 is covered by the one or more north pole regions 100A, 100B and about half of the surface area of each major surface of the magnets 46, 50 are covered by the one or more south pole regions 102A, 102B. FIG. 4A is a perspective view showing an example of the housing latch magnet 46 with a pair of north pole regions 100A radially interspersed with a pair of south pole regions 102A. FIG. 4B is a perspective view showing an example of the chassis latch magnet 50 with a corresponding pair of north pole regions 100B and a corresponding pair of south pole regions 102B. In the example shown in FIGS. 4A and 4B, each north pole region 100A, 100B and south pole region 102A, 102B has a cross-sectional shape that substantially corresponds to a circular sector (i.e., colloquially referred to as a "pie-piece shape," or a "wedge" shape). In an example, each north pole region 100A or 100B of a particular magnet 46 or 50 has substantially the same size and shape and is positioned on opposite side of the magnet 46 or 50 from the other north pole region 100A or 100B, e.g., with the north pole regions 100A or 100 being rotated about an axis of the magnet 46 or 50 by an angle of about 180°. Similarly, in an example, each south pole region 102A or 102B has substantially the same size and shape and is positioned on opposite side of the magnet 46 or 50 from the other south pole region 102A or 102B, e.g., with the south pole regions 102A or 102B being rotated about an axis of the magnet 46 or 50 by an angle of about 180°. In an example, the south pole regions 102A or 102B are interspersed between the north pole regions 100A or 100B on each magnet 46, 50, i.e., with each south pole region 102A or 102B being positioned between the pair of north pole regions 100A or 100B so that each south pole region 102A or 102B is rotated about the axis of the magnet 46, 50 by about 90° relative to each north pole region 100A or 100B.

In an example, when the housing latch magnet 46 and the chassis latch magnet 50 are brought near each other, a magnetic connection can be formed when the magnets 46 and 50 are in an orientation relative to one another such that, each north pole region 100A of the housing latch magnet 46 is magnetically aligned with (i.e., is positioned across from) a corresponding south pole region 102B of the chassis latch magnet 50, or each south pole region 102A of the housing latch magnet 46 is magnetically aligned with (i.e., position across from) a corresponding north pole region 100B of the chassis latch magnet 50. The term "magnetically aligned" (or similar terms such as "magnetic alignment" or simply "aligned" or "alignment" of magnets) refers to at least one of the magnetic poles or magnetic pole regions of a first magnet being in a position relative to one or more opposite magnetic poles or magnetic pole regions of a corresponding second magnet such that a magnetic attraction force is generated between the first magnet and the second magnet. For example, a north pole or north pole region of a first magnet will be considered "magnetically aligned" when a substantial portion of the area of the north pole or north pole region of the first magnet is sufficiently proximate to a substantial portion of the area of a corresponding south pole or south pole region of a corresponding second magnet so that a magnetic attraction force of a specified strength is generated between the first magnet and the second magnet. Similarly, a south pole or south pole region will be considered "magnetically aligned" when a substantial portion of the area of the south pole or south pole region is sufficiently proximate to a substantial portion of the area of a corresponding north pole or north pole region to generate a magnetic attraction force of the specified strength such that the display module is magnetically secured to the support chassis. In some examples, the "specified strength" is sufficient so that the attraction forces can collectively hold the weight of a display module onto a support chassis or to transfer movement from a moving tool magnet to a corresponding latch magnet. In some examples, a first magnet will be considered "magnetically aligned" when only the north pole or north pole regions of the first magnet are substantially proximate to the south pole or south pole regions of the second magnet. In some examples, a first magnet will be considered "magnetically aligned" when only the south pole or south pole regions of the first magnet are substantially proximate to the north pole or north pole regions of the second magnet. In yet other examples, a first magnet will be considered "magnetically aligned" when the north pole or north pole regions of the first magnet are substantially proximate to the south pole or south pole regions of the second magnet and the north pole or north pole regions of the first magnet are substantially proximate to the south pole or south pole regions of the second magnet In an example, the magnetic attraction between the housing latch magnet 46 and the chassis latch magnet 50 (or the combined magnetic attraction of all of the housing latch magnets 46 and the corresponding chassis latch magnets 50 if a plurality of magnetic latches 40 are used for mounting the display module 12) is of sufficient strength to hold the display module 12 to the support chassis 14. In an example, this magnetic attraction is sufficient to mount the display module 12 to the support chassis 14 without the use of any other mounting structures, fasteners, or means.

In an example, the display module 12 is disconnected from the support chassis 14 (e.g., to conduct repairs on either assembly, or to replace a malfunctioning display module 12) by moving the housing latch magnet 46 to an unlatched position. For example, the housing latch magnet 46 can be rotated (i.e., by rotating the torque magnet 42, which rotates the housing latch magnet 46 via the shaft 51), which moves the one or more north pole regions 100A of the housing latch magnet 46 out of magnetic alignment with the one or more south pole regions 102B of the chassis latch magnet 50 or it moves the one or more south pole regions 100A of the housing latch magnet 46 out of magnetic alignment with the one or more north pole regions 102B of the chassis latch magnet 50, or both (as they were magnetically aligned when the housing latch magnet 46 was in a latched position). In an example, when the housing latch magnet 46 is moved to the unlatched position, the one or more north pole regions 100A of the housing latch magnet 46 become magnetically misaligned with the one or more north pole regions 102B of the chassis latch magnet 50 or the one or more south pole regions 100A of the housing latch magnet 46 become magnetically misaligned with the one or more south pole regions 102B of the chassis latch magnet 50. The term "magnetically misaligned" (or similar terms such as "magnetic misalignment" or simply "misaligned" or "misalignment" of magnets) refers to at least one of the magnetic poles or magnetic pole regions of a first magnet being in a position relative to one or more of the same magnetic pole or magnetic pole regions of a corresponding second magnet such that a magnetic repulsion force is generated tending to push apart the first magnet and the second magnet. For example, a north pole or north pole region of a first magnet will be considered "magnetically misaligned" when a substantial portion of the area of the north pole or north pole region of the first magnet is sufficiently proximate to a substantial portion of the area of a corresponding north pole or north pole region of a second magnet so that a magnetic repulsion force is generated between the first magnet and the second magnet. Similarly, the first and second magnets can be considered "magnetically misaligned" when a substantial portion of the area of the south pole or south pole region of the first magnet is sufficiently proximate to a substantial portion of the area of a corresponding south pole or south pole region of the second magnet such that a magnetic repulsion force is generated. In some examples, a first magnet will be considered "magnetically misaligned" when only the north pole or north pole regions of the first magnet are substantially proximate to the north pole or north pole regions of the second magnet. In some examples, a first magnet will be considered "magnetically misaligned" when only the south pole or south pole regions of the first magnet are substantially proximate to the south pole or south pole regions of the second magnet. In yet other examples, a first magnet will be considered "magnetically misaligned" when the north pole or north pole regions of the first magnet are substantially proximate to the north pole or north pole regions of the second magnet and the south pole or south pole regions of the first magnet are substantially proximate to the south pole or south pole regions of the second magnet In such an example, the magnets 46 and 50 are no longer magnetically attracted to each other, but rather are magnetically repelled to make breaking the mounting connection between the display module 12 and the support chassis 14 easier.

In an example, alignment of housing latch magnet 46 and the chassis latch magnet 50 can be accomplished through a guide. For example FIG. 4A shows a physical guide 55 that projects from the display module 12, i.e., rearward from a rear surface of the display module housing 43. In an example, the guide 55 is received by a corresponding bore 56 in the support chassis 14. When the guide 55 is received by the bore 56, the housing latch magnet 46 and the chassis latch magnet 50 are magnetically aligned. Although the guide 55 is shown on the housing 43 and the bore is shown on the support chassis 14, in other examples, their arrangement can be reversed, i.e., with a guide being included on the support chassis 14 that is received by a bore in the display module housing 43. Other mating guiding features can be used other than a guide 55 and a corresponding bore 56 without varying from the scope of the present disclosure, including, but not limited to, a pin or boss and a corresponding hole, a tab and a corresponding slot, a unique three-dimensional profile and a mirror-image or reverse-image three dimensional mating profile, and the like.

As described herein, in some examples, attaching or detaching the display module 12 and the support chassis 14 is performed by rotating the housing latch magnet 46. As also described herein, in some examples, rotation of the housing latch magnet 46 is driven through rotation of the torque magnet 42, which is transferred to the housing latch magnet 46 by the shaft 51. In an example, the torque magnet 42 can be rotated, for example, with an actuation tool. An example of an actuation tool 58 is shown in FIGS. 3A and 3B. As shown, the example actuation tool 58 includes a first end 60 and a generally opposed second end 62. In an example, a fourth magnet 64 is located at the first end 60, which will be referred to herein as the "latch tool magnet 64." In an example, the latch tool magnet 64 is configured to magnetically engage with the torque magnet 42. As used herein, "magnetically engaged" (or similar terms such as "magnetically engages," "magnetically engaging," or "magnetic engagement") when used to refer to the interaction between the latch tool magnet 64 and the torque magnet 42, refers to the formation of a magnetic attraction force between the magnets 42 and 64 that is sufficient so that movement of the latch tool magnet 64 from a first position to a second position (i.e., via manual movement of the actuation tool 58) results in a corresponding movement of the torque magnet 42 from its first position to its second position. For example, if the change of the torque magnet 42 from the first position to the second position involves a rotation of the torque magnet 42, then the magnetic engagement provides for torque generated by rotation of the latch tool magnet 64 (i.e., from rotation of the actuation tool 58)

to be transferred from the latch tool magnet 64 to the torque magnet 42, where the transferred torque is sufficient to rotate the torque magnet 42, such as from its first position to its second position. In an example, the actuation tool 58 includes a protective liner 65 covering at least a portion of the first end 60 or the second end 62, or both, e.g., so that the protective liner 65 covers at least a portion of the latch tool magnet 64. The protective liner 65 can be made out of suitably soft material in order to minimize the likelihood of the actuation tool 58 damaging any components on the display module 12 while the actuation tool 58 is being used to actuate the magnetic latch 40, for example to avoid damaging the LEDs 18 on the display module 12. Examples of materials that can be used for the protective liner include, but are not limited to, rubber, cloth, plastics and other polymers, or any other substantially soft and durable material.

In an example, the first end 60 of the actuation tool 58 is placed in direct contact with the front face 28 of the display module 12. As noted above, the torque magnet 42 can be located in a pocket 44 in the display housing 43, which can be located behind a circuit board ("PCB") onto which the LEDs 18 are mounted. Therefore, in some examples, the actuation tool 58 need not be directly in contact with the torque magnet 42, but rather can be placed onto the front face 28 in a position over the torque magnet 42. In an example, a user of the actuation tool 58 can locate a proper position for the actuation tool 58 by moving the first end 60 of the actuation tool 58 across the front face 28 and stopping when the user feels magnetic engagement between the torque magnet 42 and the latch tool magnet 64.

In another example, the display module 12 can be programmed to show the location of the torque magnet 42, such as by lighting up the LEDs 18 at the location with a location indicator symbol corresponding to the position of the torque magnet 42 behind the front face 28. For example, the display module 12 can be electrically connected to a control architecture (e.g., one or more controllers configured with controller firmware or software for operating the display modules 12 individually and the display 10 overall). The control architecture can be configured to possess address information for the LED or LEDs 18 that are located over the torque magnet 42. When the user initiates a locator instruction for the torque magnet 42, the control architecture directs a specific group of LED or LEDs 18 corresponding to the location of the torque magnet 42 to display the location indicator symbol. The user can then position the first end 60 of the actuation tool 58 on the location indicated by the location indicator symbol.

Once the latch tool magnet 64 engaged with the torque magnet 42, the user can move the actuation tool 58 to a desired position, i.e., to a first position associated with an unlatched position for the magnetic latch 40 if the user desires to disengage and remove the display module 12 from the support chassis 14 or to a second position associated with a latched position for the magnetic latch 40 if the user desires to mount and secure the display module 12 to the support chassis 14. The movement of the actuation tool 58 causes the latch tool magnet 64 torque magnet 42, and in turn the housing latch magnet 46, to each selectively move toward a desired position for the housing latch magnet 46 (i.e., toward the latched position for magnetic coupling between the housing latch magnet 46 and the chassis latch magnet 50 in order to mount the display module 12 to the support chassis 14, or to the unlatched position for detaching the display module 12 from the support chassis 14). The term "magnetic coupling" can refer to a magnetic attraction force between the housing latch magnet 46 and the chassis latch magnet 50 that is sufficiently strong to hold the display module 12 onto the support chassis 14, and in some examples the cumulative effective of all the magnetic couplings between the magnet 46 and the magnet 50 is sufficient to mount the display module 12 to the support chassis 14 without the use of other fasteners or mounting structures As described above, in some examples, the movement to the desired position includes rotating the actuation tool 58, which results in rotation of the latch tool magnet 64, which in turn rotates the torque magnet 42 because of the magnetic engagement between the latch tool magnet 64 and the torque magnet 42. The rotation of the torque magnet 42 causes the housing latch magnet 46 to rotate because of its connection to the torque magnet 42 with the shaft 51, and the rotation of the housing latch magnet 46 can allow the housing latch magnet 46 to magnetically couple with the chassis latch magnet 50 to mount the display module 12 to the support chassis 14.

Those of skill in the art will understand that although only one magnetic latch 40 is depicted in the figures, each particular display module 12 can be mounted to the support chassis 14 using as many magnetic latches 40 as are necessary or desired to mount the display module 12 to the support chassis 14. In an example, the number of magnetic latches 40 used to mount a display module 12 is selected so that the display module 12 can be mounted to the support chassis 14 and supported by the magnetic coupling. The latches 40 can also be ordered around the display module 12 in any suitable configuration. For example, four latches 40 can be used with one magnetic latch 40 in each corner of the display module 12.

Figure 5:
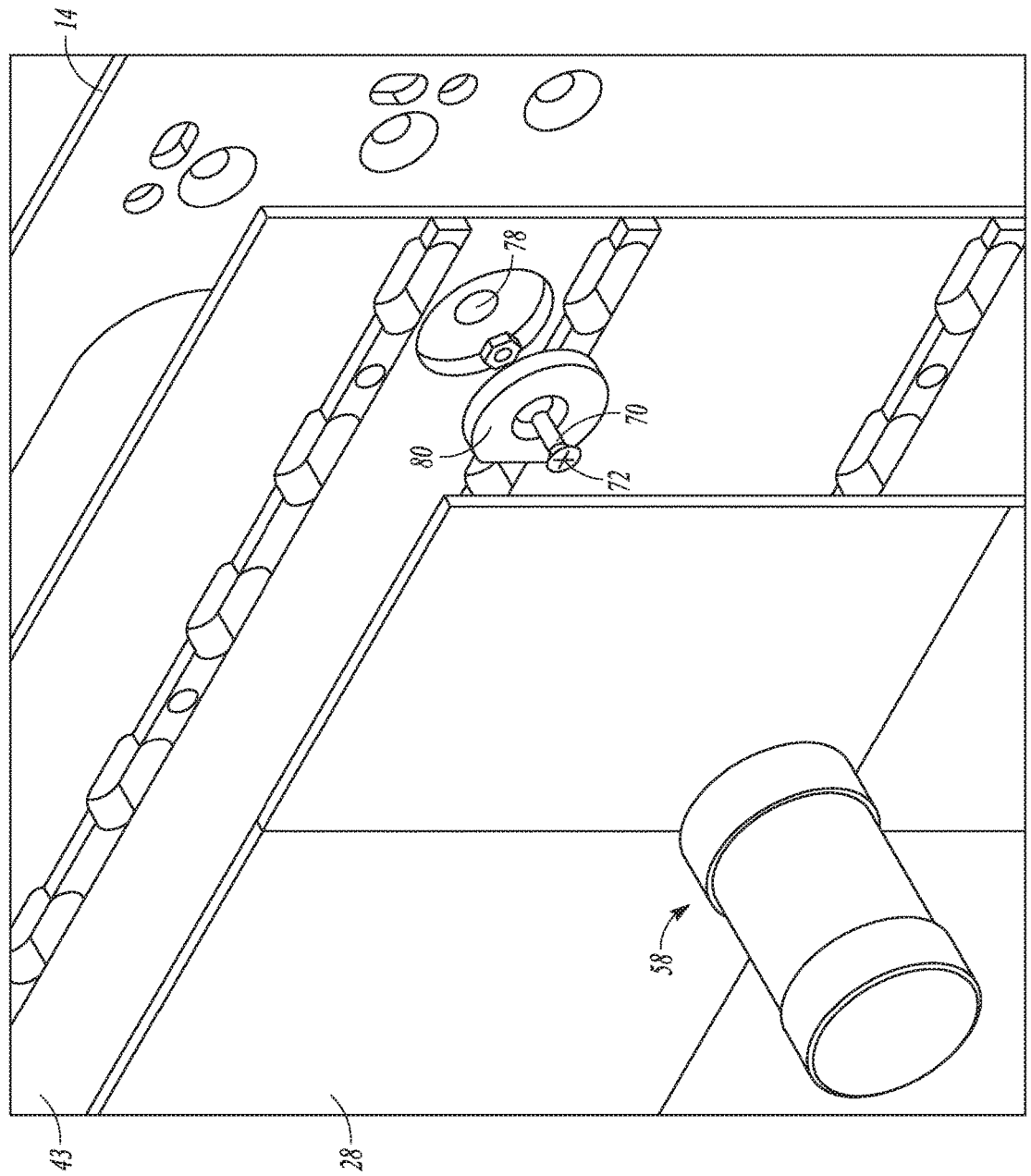
FIG. 5 is an exploded perspective view of a biasing element, in accordance with various embodiments.
Figure 6A:
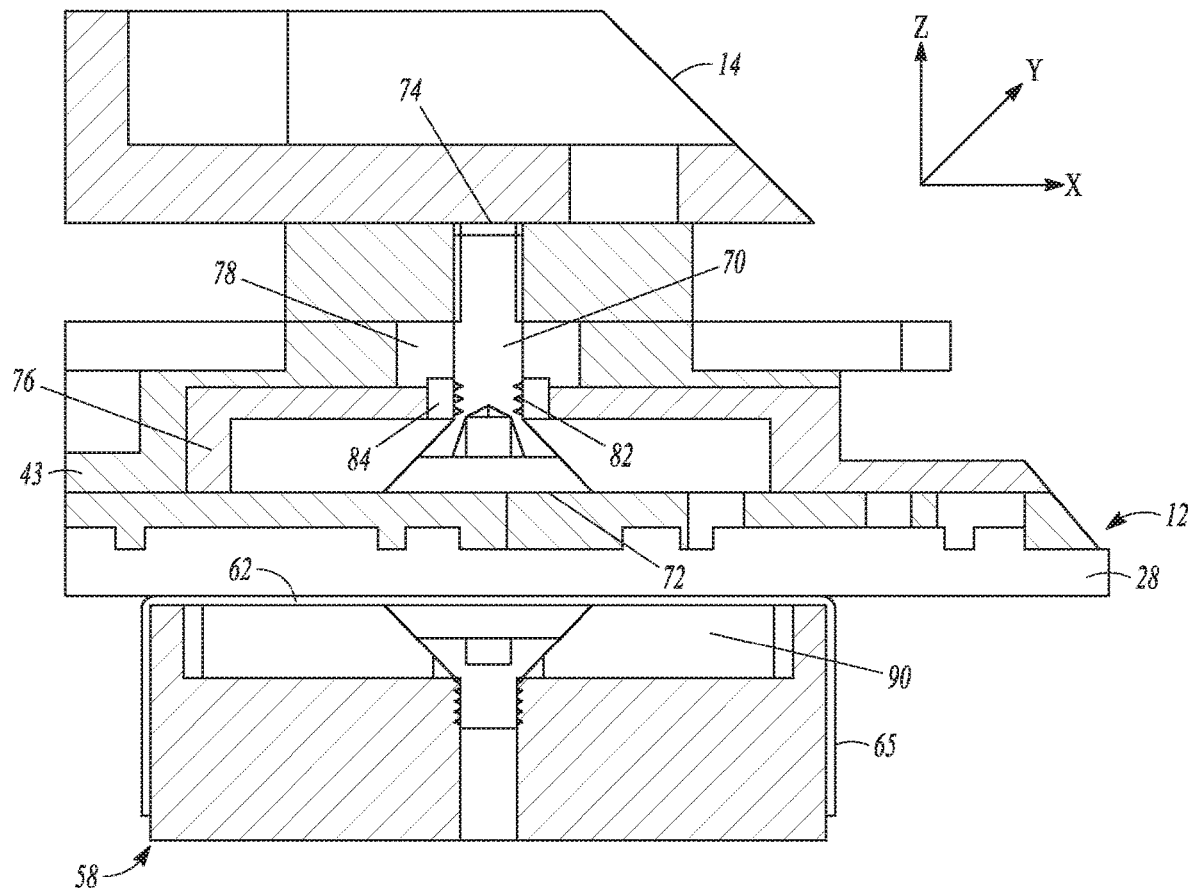
FIGS. 6A and 6B are sectional views of the biasing element of FIG. 5, in accordance with various embodiments.
Figure 6B:
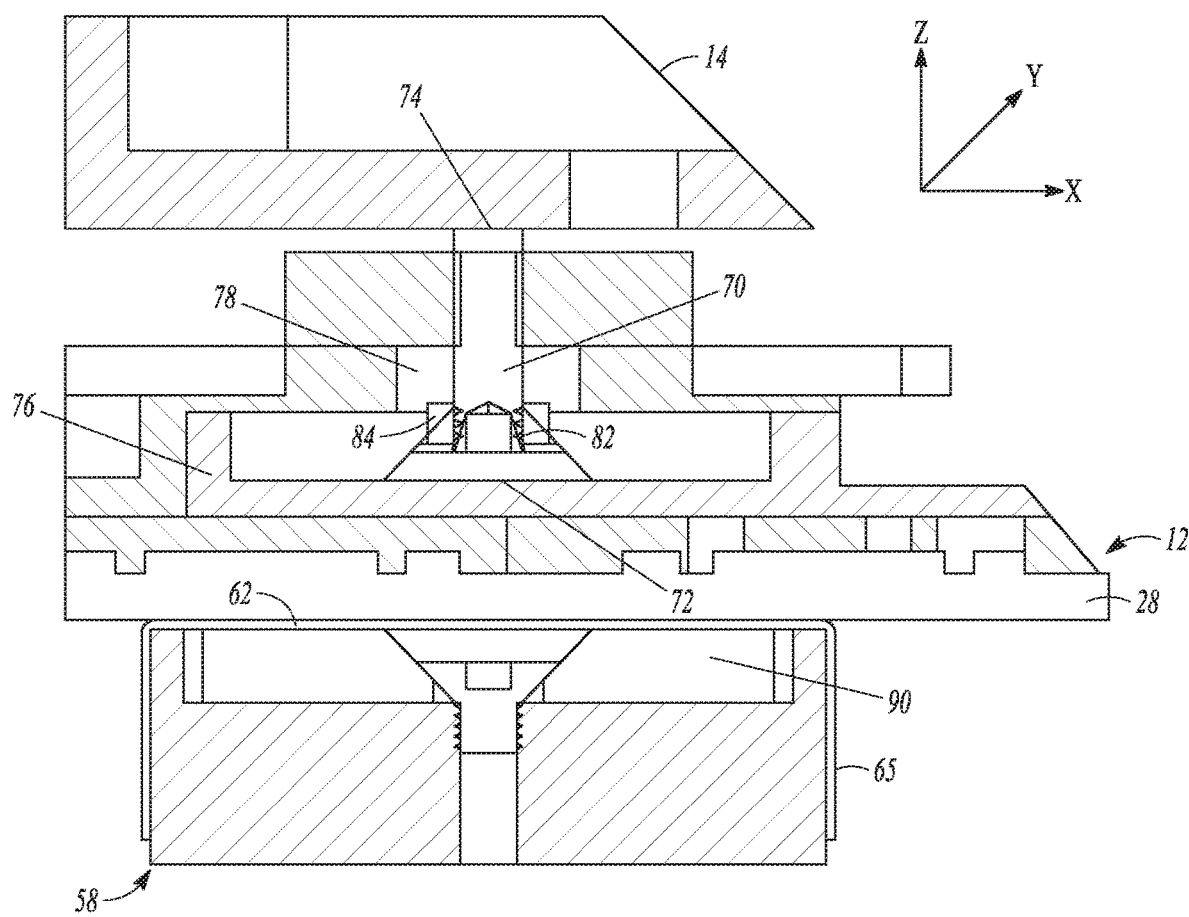

In addition to magnetic latch 40, FIG. 3B also shows a biasing member 70. The biasing member 70 is also shown in FIGS. 5, 6A, and 6B. FIG. 5 is an exploded perspective view of the biasing member 70 while FIGS. 6A and 6B are sectional views of the biasing member 70. As shown, the biasing member 70 includes a first end 72 and a second end 74 with a shaft therebetween. The biasing member 70 is movable relative to the display module 12. The first end 72 is located within the display module 12 such as near the first major surface of the display module 12 at a pocket 76. In an example, the biasing member 70 extends through a passage 78 of the display module 12 and terminates at the second end 74, which is located near the second major surface of the display module 12 as defined by the housing 43 at a biasing location. Biasing member magnet 80 is attached to the first end 72 of the biasing member.

As shown, the biasing member 70 is a threaded element that includes a threaded surface between the first end 72 and the second end 74. Suitable examples of threaded elements include a bolt or a screw. The biasing member is threadingly engaged with a threaded surface 82 of the passage 78. The threaded surface 82 can be provided directly within the passage 78 or, as shown in FIGS. 6A and 6B, a nut 84 can be placed within the passage 78. In such an example, the threaded surface is engaged with the nut. As the threaded surface 82 is rotated the nut 84 remains stationary thus allowing for movement of the biasing member 70 in the z-direction.

In operation, the biasing member 70 can be infinitely rotated between a first forward position and second rearward position. In FIG. 6A, the biasing member 70 is shown in the first forward position in which the second end 74 is disposed within the housing 43. As shown, in FIG. 6A, when the biasing member 70 is in the first forward position there is substantially no gap between the housing 43 and the support chassis 14. However, as shown in FIG. 6B, when the biasing member 70 is in the second rearward position the second end 74 is disposed outside of housing 43 and engaged the support chassis 14. This creates a gap between the housing 43 from the support chassis 14 and thus increases the distance in the z-direction therebetween. The term "position" when referring to the biasing member refers to a position of the second end 74 relative to a reference structure (such as the housing 43 of the display module 12). For example, the second end 58 can be considered to have changed from the "first position" to the "second position" if the second end 52 has been moved laterally relative to the display module 12 (i.e., along the first major surface), or if the relative orientation of the second end 52 has changed relative to the display module 12 (i.e., by rotating the magnet 80 relative to the display module 12 such that the direction of polar axis of the magnet, e.g., about a rotational axis that is normal or substantially normal to the first major surface).

The biasing member 70 can be actuated between the first forward and second rearward positions with the actuation tool 58, in a manner similar to that of latch 40. For example, the tool magnet 64 can be placed in direct contact with the front face 28 over the biasing member magnet 80. In an example a user of the actuation tool can be guided to the proper position by moving the actuation tool 58 across the front face 28 and stopping when the user feels the engagement between the biasing member magnet 80 and the tool magnet 64. This indicates that the actuation tool 60 is proximate to the location of the biasing member 70. The magnetic attraction between the actuation tool 60 and the biasing magnet 80 is sufficient to allow rotation of the biasing tool 60 to cause rotation of the biasing magnet 80.

In another example the screen can be programmed to show the location of the biasing member magnet 80, and any torque magnets 42 of magnetic latch 40, by lighting up at the location of the respective magnets in a manner such as that described herein with respect to the torque magnet 42. In other examples of the actuation tool a second tool magnet 90 can be placed on the second end 62 of the actuation tool. The polarity of the tool magnet 64 and the second tool magnet 90 can be reversed. Similarly, the polarity of the torque magnet 42 and the biasing member magnet 80 can be different from each other so as to be attracted to only one of the tool magnet 64 and the second tool magnet 90. For example, tool magnet 64 can have a north pole whereas torque magnet 42 can have a south pole and second tool magnet 90 can have a south pole whereas biasing member magnet 80 has a northern pole. This can help a user identify whether biasing member magnet 80 or tool magnet 64 is engaged.

Once the user has either the tool magnet 64 or the second tool magnet 90 engaged with the biasing member magnet 80, the user can rotate the actuation tool 58. The rotation of the actuation tool 58 drives the rotation of the biasing member 70 to rotate selectively between the first forward or second rearward position by imparting torque on the magnet 80. Adjusting the biasing member 70 can help to better align the display module 12 with an adjacent display module 12. This can improve the picture shown by multiple display modules 12. That is the multiple display modules can be aligned better. The better alignment can enhance the clarity of the picture being shown across adjacent displays. It is understood that although only biasing member 70 is depicted. Each display module 12 can be include multiple biasing members 70 to better facilitate the alignment of adjacent display modules 12. The biasing members 70 can also be ordered around the display module 12 in any suitable configuration. For example, biasing members 70 can be used with one biasing member 70 in each corner of the display module 12.

Although display 10 is shown as including both magnetic latch 40 and biasing member 70 it is understood that in various examples display 10 can include either magnetic latch 40 alone of biasing member 70 alone.

Additional Embodiments

The following exemplary embodiments are provided, the numbering of which is not to be construed as designating levels of importance:

Embodiment 1 provides a display module comprising:
a module support structure;
a plurality of light-emitting elements coupled to the module support structure; and
one or more latch assemblies configured to removeably couple the module support structure to a support chassis, wherein each of the one or more latch assemblies comprises;
  a first magnet movably coupled to the module support structure at a first location, the first magnet being movable relative to the module support structure between a first position and a second position;
  a second magnet movably coupled with the module support structure at a second location, the second magnet being movable relative to the module support structure between a first corresponding position and a second corresponding position; and
  a shaft connecting the first magnet and the second magnet so that the first magnet and the second magnet move together such that the second magnet is in the first corresponding position when the first magnet is in the first position and is in the second corresponding position when the first magnet is in the first position;
  wherein a magnetic attraction between the second magnet and a corresponding third magnet attached to the support chassis is stronger when the second magnet is in the first corresponding than when the second magnet is in the second corresponding position.

Embodiment 2 provides the display module according to Embodiment 1, wherein the first magnet is at least partially located within a first cavity in the module support structure.

Embodiment 3 provides the display module according to Embodiment 2, wherein the module support structure defines a front face, wherein the first cavity is at or proximate to the front face.

Embodiment 4 provides the display module according to either one of Embodiments 2 or 3, wherein the second magnet is at least partially located within a second cavity in the module support structure.

Embodiment 5 provides the display module according to Embodiment 4, wherein the module support structure defines a rear face, wherein the second cavity is at or proximate to the rear face.

Embodiment 6 provides the display module according to either one of Embodiments 4 or 5, wherein the module support structure comprises a passage spanning between the first cavity and the second cavity, wherein the shaft is disposed within the passage to join the first magnet to the second magnet.

Embodiment 7 provides the display module according to any one of Embodiments 1-6, wherein the first magnet, the shaft, and the second magnet are configured to rotate together, wherein the first magnet rotates between the first position and the second position and the second magnet rotates between the first corresponding position and the second corresponding position, respectively, as the shaft rotates.

Embodiment 8 provides the display module according to any one of Embodiments 1-7, wherein the second magnet comprises a north pole and a south pole and the corresponding third magnet comprises a corresponding north pole and a corresponding south pole, and wherein the north pole of the second magnet is magnetically aligned with the corresponding south pole of the corresponding third magnet when the second magnet is in the first corresponding position.

Embodiment 9 provides the display module according to Embodiment 8, wherein when the second magnet is in the second corresponding position one or both of: the north pole of the second magnet is magnetically aligned with the corresponding north pole of the third magnet; or the south pole of the second magnet is magnetically aligned with the corresponding south pole of the of the corresponding third magnet.

Embodiment 10 provides the display module according to any one of Embodiments 1-9, wherein the display module is magnetically secured to the support chassis when the second magnets of the one or more latch assemblies are in the first corresponding position.

Embodiment 11 provides the display module according to Embodiment 10, wherein the display module is removable from the support chassis when the second magnets of the one or more latch assemblies are in the second corresponding position.

Embodiment 12 provides the display module according to any one of Embodiments 1-11, wherein the plurality of light-emitting elements form a display surface at a front face of the display module.

Embodiment 13 provides the display module according to Embodiment 12, wherein the display surface ranges from about 90% to about 100% of a surface area of the front face.

Embodiment 14 provides a latching system for removably coupling a display module to a support chassis, the latching system comprising:
one or more magnet subassemblies each including;
  a first magnet movably coupleable to the display module at a first location, wherein the first magnet is movable relative to the display module between a first position and a second position,
  a second magnet movably coupled to [?] the display module at a second location, and
  a shaft disposed between the first location and the second location, wherein the shaft connects the first magnet and the second magnet so that the first magnet and the second magnet move together such that the second magnet is in a first corresponding position when the first magnet is in the first position and is in a second corresponding position when the first magnet is in the second position;
a corresponding third magnet attachable to the support chassis for each of the one or more magnet subassemblies, wherein the second magnet and the corresponding third magnet are proximate to each other when the display module is mounted to the support chassis, wherein a mounting magnetic force is formed between the second magnet and the fourth magnet when the second magnet is in the first corresponding position; and
an actuation tool comprising a fourth magnet, wherein the actuation tool is positionable proximate to the first magnet of a corresponding one of the one or more magnet subassemblies so that an actuation magnetic attraction is formed between the fourth magnet and the first magnet so that when the actuation tool is moved from an unlatched position toward a latched position the first magnet will move from the first position toward the second position, which will cause the second magnet to move from the first corresponding position to the second corresponding position so that the mounting magnetic attraction is generated between the second magnet and the third magnet.

Embodiment 15 provides the latching system according to Embodiment 14, wherein the actuation tool comprises a tool body having a first end and a second end, wherein the fourth magnet is disposed at or near the first end.

Embodiment 16 provides the latching system according to Embodiment 14, wherein the actuation tool is configured so that the actuation magnetic attraction between the fourth magnet and the first magnet allows a rotation of the actuation tool to impart a corresponding rotation on the first magnet, the connecting member, and the second magnet.

Embodiment 17 provides the latching system according to Embodiment 16, wherein the rotation of the actuation tool causes the first magnet to rotate from the first position toward the second position and the second magnet to rotate from the first corresponding position toward the second corresponding position.

Embodiment 18 provides the latching system according to either one of Embodiments 16 or 17, wherein the display module comprises a front display surface, wherein the first magnet is disposed at or proximate to the front display surface, and wherein the first end of the actuation tool is in direct contact with the front display surface during the rotation.

Embodiment 19 provides the latching system according to any one of Embodiments 15-18, wherein the first magnet and the fourth magnet are free of direct contact between each other during the rotation.

Embodiment 20 provides a method comprising:
providing or receiving a display module comprising a module support structure and a latch assembly coupled to the module support structure,
wherein the latch assembly comprises:
  a first magnet movably coupled to the module support structure at a first location, the first magnet being movable relative to the module support structure between a first latched position and a first unlatched position;
  a second magnet movably coupled with the module support structure at a second location, the second magnet being movable relative to the module support structure between a second unlatched position and a second latched position; and
  a shaft connecting the first magnet and the second magnet so that the first magnet and the second magnet move together such that the second magnet is in the second unlatched position when the first magnet is in the first latched position and is in the latched position when the first magnet is in the second position;
providing or receiving a support chassis comprising a third magnet attached thereto;
positioning the display module so that the second magnet of the latch assembly is proximate to the third magnet; and
moving the first magnet of the latch assembly from the first unlatched position to the first latched position so that the second magnet is moved from the second unlatched position to the second latched position so that a north pole of the second magnet is aligned with a south pole of the third magnet, or a south pole of the second magnet is aligned with a north pole of the third magnet, or both, so that a magnetic mounting force is formed between the second magnet of the latch assembly and the third magnet.

Embodiment 21 provides the method of Embodiment 20, wherein the display module further comprises a second latch assembly coupled to the module support structure, the second latch assembly comprising:
a fourth magnet movably coupled to the module support structure at a fourth location, the fourth magnet being movable relative to the module support structure between a third latched position and a third unlatched position;
a fifth magnet movably coupled with the module support structure at a fifth location, the fifth magnet being movable relative to the module support structure between a fourth unlatched position and a fourth latched position; and
a second shaft connecting the fourth magnet and the fifth magnet so that the fourth magnet and the fifth magnet move together such that the fifth magnet is in the fourth unlatched position when the fourth magnet is in the third latched position and is in the latched position when the fourth magnet is in the fourth latched position; wherein the support chassis further comprises a sixth magnet attached thereto; and
wherein the method further comprises moving the fourth magnet of the second latch assembly from the third unlatched position to the third latched position so that the fifth magnet is moved from the fourth unlatched position to the fourth latched position so that a north pole of the fifth magnet is aligned with a south pole of the sixth magnet, or a south pole of the fifth magnet is aligned with a north pole of the sixth magnet, or both, so that a second magnetic mounting force is formed between the fifth magnet of the second latch assembly and the sixth magnet.

Embodiment 22 provides the method of either one of Embodiment 20 or Embodiment 21, wherein the moving of the first magnet from the first position to the second position includes:
positioning an actuation tool comprising a tool magnet proximate to the first magnet so that an actuating magnetic attraction is formed between the tool magnet and the first magnet; and
moving the actuation tool so that the tool magnet moves from a first tool position to a second tool position relative to the display module,
wherein the actuating magnetic attraction between the tool magnet and the first magnet causes the first magnet to move from the first position when the tool magnet is in the first tool position to the second position when the tool magnet is in the second tool position, and
wherein the shaft connecting the first magnet and the second magnet causes the second magnet to move from the unlatched position when the first magnet is in the first position to the latched position when the first magnet is in the second position so that the magnetic mounting force between the second magnet and the third magnet is formed.

Embodiment 23 provides the method of Embodiment 22, wherein the moving of the actuation tool comprises rotating the actuation tool,
wherein the second tool position of the tool magnet is in a rotated orientation relative to the first tool position,
wherein the first position of the first magnet is in a rotated orientation relative to the first position, and
wherein the latched position of the second magnet is in a rotated orientation relative to the unlatched position.

Embodiment 24 provides the method of Embodiment 23, wherein the rotating of the actuation tool aligns the north pole of the second magnet with the south pole of the third magnet, or aligns the south pole of the second magnet with the north pole of the third magnet, or both.

Embodiment 25 provides the method of any one of Embodiments 20-24, further comprising detaching the display module from the support chassis, the detaching comprising:
moving the first magnet of the latch assembly away from the second position so that the second magnet of the latch assembly is moved away from the latched position such that the north pole of the second magnet is aligned or substantially aligned with the north pole of the third magnet, or the south pole of the second magnet is aligned or substantially aligned with the south pole of the third magnet, or both; and
removing the display module from the support chassis.

Embodiment 26 provides the method of Embodiment 25, wherein the moving of the first magnet of the latch assembly away from the second position includes:
positioning an actuation tool comprising a tool magnet proximate to the first magnet of the latch assembly so that an actuating magnetic attraction is formed between the tool magnet and the first magnet; and
moving the actuation tool so that the tool magnet moves from a second tool position to a first tool position relative to the display module,
wherein the actuating magnetic attraction between the tool magnet and the first magnet causes the first magnet to move from the second position when the tool magnet is in the second tool position to the first position when the tool magnet is in the first tool position, and
wherein the shaft connecting the first magnet and the second magnet causes the second magnet to move from the latched position when the first magnet is in the second position to the unlatched position when the first magnet is in the first position so that the magnetic mounting force between the second magnet and the third magnet is interrupted.

Embodiment 27 provides the method of Embodiment 26, wherein the moving of the actuation tool comprises rotating the actuation tool.

What is claimed is:
1. A display module comprising:
a module support structure;
a plurality of light-emitting elements coupled to the module support structure; and
one or more latch assemblies configured to removeably couple the module support structure to a support chassis, wherein each of the one or more latch assemblies comprises;
a first magnet movably coupled to the module support structure at a first location, the first magnet being rotatable relative to the module support structure between a first position and a second position;
a second magnet movably coupled with the module support structure at a second location, the second magnet being rotatable relative to the module support structure between a first corresponding position and a second corresponding position; and
a shaft connecting the first magnet and the second magnet wherein the first magnet, the shaft, and the second magnet are configured to rotate together such that the second magnet is in the first corresponding position when the first magnet is in the first position and is in the second corresponding position when the first magnet is in the second position;
wherein a magnetic attraction between the second magnet and a corresponding third magnet attached to the support chassis is stronger when the second magnet is in the first corresponding than when the second magnet is in the second corresponding position.

2. The display module according to claim 1, wherein the first magnet is at least partially located within a first cavity in the module support structure.

3. The display module according to claim 2, wherein the module support structure defines a front face, wherein the first cavity is at or proximate to the front face.

4. The display module according to claim 2, wherein the second magnet is at least partially located within a second cavity in the module support structure.

5. The display module according to claim 4, wherein the module support structure defines a rear face, wherein the second cavity is at or proximate to the rear face.

6. The display module according to claim 4, wherein the module support structure comprises a passage spanning between the first cavity and the second cavity, wherein the shaft is disposed within the passage to join the first magnet to the second magnet.

7. The display module according to claim 1, wherein the second magnet comprises a north pole and a south pole and the corresponding third magnet comprises a corresponding north pole and a corresponding south pole, and wherein the north pole of the second magnet is magnetically aligned with the corresponding south pole of the corresponding third magnet when the second magnet is in the first corresponding position.

8. The display module according to claim 7, wherein when the second magnet is in the second corresponding position one or both of: the north pole of the second magnet is magnetically aligned with the corresponding north pole of the third magnet; or the south pole of the second magnet is magnetically aligned with the corresponding south pole of the of the corresponding third magnet.

9. The display module according to claim 1, wherein the display module is magnetically secured to the support chassis when the second magnets of the one or more latch assemblies are in the first corresponding position.

10. The display module according to claim 9, wherein the display module is removable from the support when the second magnets of the one or more latch assemblies are in the second corresponding position.

11. The display module according to claim 1, wherein the plurality of light-emitting elements form a display surface at a front face of the display module.

12. The display module according to claim 11, wherein the display surface ranges from about 90% to about 100% of a surface area of the front face.

13. A latching system for removably coupling a display module to a support chassis, the latching system comprising:
one or more magnet subassemblies each including;
a first magnet rotatably coupleable to the display module at a first location, wherein the first magnet is rotatable relative to the display module between a first position and a second position,
a second magnet rotatably coupled with the display module at a second location, and
a connecting member disposed between the first location and the second location, wherein the connecting member connects the first magnet and the second magnet wherein the first magnet, the connecting member, and the second magnet are configured to rotate together such that the second magnet is in a first corresponding position when the first magnet is in the first position and is in a second corresponding position when the first magnet is in the second position;
a corresponding third magnet attachable to the support chassis for each of the one or more magnet subassemblies, wherein the second magnet and the corresponding third magnet are proximate to each other when the display module is mounted to the support chassis, wherein a mounting magnetic force is formed between the second magnet and the third magnet when the second magnet is in the first corresponding position; and
an actuation tool comprising a fourth magnet, wherein the actuation tool is positionable proximate to the first magnet of a magnet subassembly so that an actuation magnetic attraction is formed between the fourth magnet and the first magnet so that when the actuation tool is rotated from an unlatched position toward a latched position, the actuation magnetic attraction imparts a corresponding rotation on the first magnet will to rotate the first magnet from the first position toward the second position, which will cause the second magnet to rotate from the first corresponding position toward the second corresponding position so that the mounting magnetic attraction is generated between the second magnet and the third magnet.

14. The latching system according to claim 13, wherein the actuation tool comprises a tool body having a first end and a second end, wherein the fourth magnet is disposed at or near the first end.

15. The latching system according to claim 14, wherein the display module comprises a front display surface, wherein the first magnet is disposed at or proximate to the front display surface, and wherein the first end of the actuation tool is in direct contact with the front display surface during the rotation.

16. The latching system according to claim 13, wherein the first magnet and the fourth magnet are free of direct contact between each other during rotation of the actuation tool.

17. A method comprising:
providing or receiving a display module comprising a module support structure and a latch assembly coupled to the module support structure, wherein the latch assembly comprises:
a first magnet rotatably coupled to the module support structure at a first location, the first magnet being rotatable relative to the module support structure between a first position and a second position;
a second magnet rotatably coupled with the module support structure at a second location, the second magnet being rotatable relative to the module support structure between an unlatched position and a latched position; and
a shaft connecting the first magnet and the second magnet so that the first magnet and the second magnet rotate together such that the second magnet is in the unlatched position when the first magnet is in the first position and is in the latched position when the first magnet is in the second position;
providing or receiving a support chassis comprising a third magnet attached thereto;

positioning the display module so that the second magnet of the latch assembly is proximate to the third magnet; and rotating the first magnet of the latch assembly from the first position to the second position so that the second magnet is rotated from the unlatched position to the latched position so that a north pole of the second magnet is aligned with a south pole of the third magnet, or a south pole of the second magnet is aligned with a north pole of the third magnet, or both, so that a magnetic mounting force is formed between the second magnet of the latch assembly and the third magnet.

18. The method according to claim 17, wherein rotating the first magnet of the latch assembly from the first position to the second position comprises:

positioning a fourth magnet proximate to the first magnet of the latch assembly so that an actuation magnetic attraction force is formed between the fourth magnet and the first magnet; and rotating the fourth magnet so that the actuation magnetic attraction force causes the first magnet to rotate from the first position to the second position and the second magnet to rotate from the unlatched position to the latched position.

19. The method according to claim 18, wherein the display module comprises a front display surface, wherein the fourth magnet is part of an actuation tool disposed at or proximate to the front display surface, and wherein the actuation tool is in direct contact with the front display surface during rotation of the first magnet.

20. The method according to claim 18, wherein the fourth magnet and the first magnet are free of direct contact between each other during rotation of the fourth magnet.

* * * * *